United States Patent
Roderick et al.

[11] Patent Number: 6,074,488
[45] Date of Patent: Jun. 13, 2000

[54] PLASMA CHAMBER SUPPORT HAVING AN ELECTRICALLY COUPLED COLLAR RING

[75] Inventors: Craig A. Roderick, San Jose, Calif.; Dennis S. Grimard, Ann Arbor, Mich.

[73] Assignee: Applied Materials, Inc, Santa Clara, Calif.

[21] Appl. No.: 08/931,708

[22] Filed: Sep. 16, 1997

[51] Int. Cl.[7] .............................. C23C 16/00; C23F 1/02
[52] U.S. Cl. ...................... 118/728; 156/345; 118/723 E
[58] Field of Search ..................... 118/728, 500, 118/723 E, 723 ER, 723 R; 156/345; 361/234; 279/128

[56] References Cited

U.S. PATENT DOCUMENTS

| | | | |
|---|---|---|---|
| 4,184,188 | 1/1980 | Briglia | 361/234 |
| 4,767,641 | 8/1988 | Kieser et al. | 427/38 |
| 5,074,456 | 12/1991 | Degner et al. | 228/121 |
| 5,213,658 | 5/1993 | Ishida | 156/643 |
| 5,252,178 | 10/1993 | Moslehi | 156/643 |
| 5,271,788 | 12/1993 | Hasegawa et al. | 156/345 |
| 5,275,683 | 1/1994 | Arami et al. | 156/345 |
| 5,280,156 | 1/1994 | Niori et al. | 219/385 |
| 5,292,399 | 3/1994 | Lee et al. | 156/643 |
| 5,298,465 | 3/1994 | Levy | 437/225 |
| 5,315,473 | 5/1994 | Collins et al. | 361/234 |
| 5,330,607 | 7/1994 | Nowicki | 156/643 |
| 5,352,294 | 10/1994 | White et al. | 118/725 |
| 5,423,918 | 6/1995 | Gupta et al. | 134/1 |
| 5,474,649 | 12/1995 | Kava et al. | 156/643.1 |
| 5,484,486 | 1/1996 | Blackburn et al. | 118/728 |
| 5,552,124 | 9/1996 | Su | 156/345 |
| 5,556,501 | 9/1996 | Collins et al. | 156/345 |
| 5,622,593 | 4/1997 | Arasawa et al. | 156/345 |
| 5,673,922 | 10/1997 | Sherstinsky et al. | 279/133 |
| 5,685,914 | 11/1997 | Hills et al. | 118/723 E |

FOREIGN PATENT DOCUMENTS

| | | |
|---|---|---|
| 0467390 A1 | 1/1992 | European Pat. Off. |
| 0660499 | 6/1995 | European Pat. Off. |
| 3-127822 | 5/1991 | Japan |
| 9514308 | 5/1995 | WIPO |

OTHER PUBLICATIONS

U.S. Patent Application entitled, "Apparatus for Improving Wafer and Chuck Edge Protection"; filed Nov. 29, 1996; Serial No. 08/758,531; Attorney Docket No. 1478.

U.S. Patent Application entitled, "Magnetically–Enhanced Plasma Chamber with Non–Uniform Magnetic Field"; filed Jan. 2, 1997; Serial No. 08/735,444; Attorney Docket No. 1478.P1.

U.S. Patent Application entitled, "Shield or Ring Surrounding Semiconductor Workpiece in Plasma Chamber"; filed Sep. 16, 1997; Serial No. 08/931,864; Inventors: Ke, et al.; Attorney Docket No. 1478.P3.

(List continued on next page.)

*Primary Examiner*—Thi Dang
*Assistant Examiner*—Luz Alejandro
*Attorney, Agent, or Firm*—Janah and Associates

[57] ABSTRACT

A support 200 for supporting a substrate 50 in a plasma process chamber 20, comprises a dielectric member 205 having an electrode embedded therein, and having a receiving surface for receiving the substrate. An electrical conductor 210 supporting the dielectric member 205, comprises a peripheral portion 228 extending beyond the electrode in the dielectric member. A voltage supply 158 supplies an RF bias voltage to the electrode embedded in the dielectric member 205 to capacitively couple RF power from the electrode to the conductor 210, and optionally, supplies a DC voltage to electrostatically hold the substrate 50 to the dielectric member. A collar ring 230 on the peripheral portion 228 of the conductor 210, comprises a RF electrical field absorption that is sufficiently low to capacitively couple RF power from the peripheral portion of the conductor through the collar ring to a plasma sheath that extends; above the collar ring, during use of the chuck in the plasma process chamber 20. The extended RF field around the perimeter of the substrate 130 provides enhanced and more uniform plasma processing of the substrate.

42 Claims, 7 Drawing Sheets

OTHER PUBLICATIONS

H. Shan, et al., "Process Kit and Wafer Temperature Effects on Dielectric Etch Rate and Uniformity of Electrostatic Chuck," *J. Vac. Sci. Tech B.*, vol. 14, No. 1, Jan./Feb. 1996, pp. 521–526.

H. Shan, et al., "Process Kit and Wafer Temperature Effects on Dielectric Etch Rate and Uniformity of Electrostatic Chuck," Third International Workshop on Advanced Plasma Tools: Sources, Process Control, and Diagnostics; May 4, 1995.

U.S. Patent Application entitled, "High Density Plasma Process Chamber"; filed Jul. 14, 1997; Serial No. 08/893,599; Inventors: Shamouilian, et al.

PLASMA CHAMBER SUPPORT HAVING AN ELECTRICALLY COUPLED COLLAR RING

BACKGROUND

The present invention relates to a support for supporting a substrate during processing in a plasma.

An ionized gas or plasma is used in many types of manufacturing processes, including for example, semiconductor fabrication processes. For example, plasmas are used in chemical vapor deposition, etching, and ion implantation processes. Referring to FIG. 1, a typical conventional plasma process chamber 20 comprises a gas distributor 30 for distributing process gas in the chamber for forming a plasma. The process gas plasma is energized by applying a RF voltage to a cathode 40a supporting a substrate 50 and by electrically grounding an anode 40b to form a capacitive RF field in the chamber. However, conventional plasma chambers often do not provide a spatially uniform plasma sheath across the surface of the substrate 50. By spatially uniform it is meant a plasma sheath having a uniform density and/or energy distribution of plasma ions across the space occupied by the plasma sheath. A non-uniform distribution of plasma ions often occurs due to variations in the RF or DC fields or currents (as represented by the arrows 80a, 80b) across from the center 60 to the peripheral edge 70 of the substrate 50.

For example, in certain chambers, the cathode 40a comprises a periphery that extends circumferentially around the substrate 50 and is electrically isolated from the plasma by a relatively thick insulator shield 90, as shown in FIG. 1. However, the insulator shield 90 isolating the periphery of the cathode 40a can significantly influence the RF currents between the cathode 40a and the plasma sheath near the peripheral edge 70 of the substrate 50. In other process chambers, the cathode 40a stops short of, and does not extend all the way to the peripheral edge 70 of the substrate (not shown). As a result the plasma sheath forms anomalies or discontinuities near the peripheral edge 70 of the substrate.

The non-uniform plasma ion distribution obtained across the surface of the substrate 50 in such conventional chambers can cause the peripheral edge 70 of the substrate (typically extending inwardly by a distance of 15 to 20 mm from the substrate edge) to be processed at different rates or with different properties relative to the central portion 60 of the substrate 50. For example, in etching processes, plasma anomalies can result in etched features having non-uniform sidewall profiles at the edge 70 of the substrate 50. This significantly reduces the yield of integrated circuit chips obtained from the peripheral edge 70 of the substrate 50. The lower plasma ion densities that can occur at the peripheral edge 70 of the substrate 50 also result in slower and less efficient processing of the peripheral edge 70 of the substrate.

Another disadvantage of conventional plasma process chambers arises from the substrate holding system 100 that is used to hold the substrate in the process chamber 20. Conventional holding systems 100 include mechanical clamps that hold the periphery of the substrate, vacuum systems, or electrostatic chucking systems. Mechanical clamps (not shown) cover the edge of the substrate and reduce substrate yields. Vacuum chucks (also not shown) can cause contamination of the substrate 50 from the flow of process gas and suspended particles toward the vacuum port behind the substrate. Electrostatic chucking systems, as shown in FIG. 1, typically comprise an electrically insulated electrode 110 that is positioned below the substrate 50 to electrostatically attract the substrate 50 using electrostatic charge. While electrostatic chucks solve certain problems of mechanical and vacuum chucks, they are often easily eroded in the chamber because the insulator covering the surface of the chuck is made of a polymeric material that is easily eroded in the plasma process gas. Also, electrostatic chucks require separate power supplies 120 and the electrode 110 of the chuck has to be entirely electrically insulated from the cathode 40a which lies below the chuck. Furthermore, the insulator material that surrounds the electrode 110 of the chuck, can reduce electrical coupling from the cathode 40a to the plasma sheath and/or the transfer of heat from the substrate 50 to the cathode 40a.

Thus, there is a need for an apparatus that provides a more spatially uniform plasma sheath across the surface of a substrate. There is also a need for the apparatus that extends the RF and DC field components in the chamber beyond the peripheral edge of the substrate to form a plasma sheath that also extends beyond the peripheral edge of the substrate. There is a further need for an apparatus that can electrostatically hold the substrate on a support and couple RF power to a plasma above the substrate, without requiring multiple overlying structures, such as the electrostatic chuck and cathode structures.

SUMMARY

The present invention is directed to a substrate support that provides a uniform plasma sheath across a surface of a substrate in a plasma process chamber, and that can also be used to electrostatically hold the substrate in the chamber. In one aspect, the present invention comprises a dielectric member having an electrode embedded therein and a receiving surface for receiving a substrate. An electrical conductor supporting the dielectric member, comprises a peripheral portion extending beyond the electrode in the dielectric member. A voltage supply supplies a RF bias voltage to the electrode embedded in the dielectric member to capacitively couple RF power from the electrode to the conductor. A collar ring on the peripheral portion of the conductor, comprises a RF electrical field absorption sufficiently low to capacitively couple RF power from the peripheral portion of the conductor through the collar ring to a plasma during use of the chuck in a plasma process chamber. The extended plasma sheath above the perimeter of the substrate provides enhanced processing rates and processing uniformity.

Preferably, the collar ring comprises a thin coating or layer, or an annular ring, of dielectric material covering the peripheral portion of the conductor. The collar ring allows RF field components from the peripheral portion of the conductor to couple therethrough to the plasma sheath. Preferably, the dielectric material comprise a semiconducting dielectric material having a low resistance of about $10^{-3}$ $\Omega$cm to about $10^1$ $\Omega$cm, and that is sufficiently leaky to allow a small current to flow through the dielectric material when a voltage is applied to the electrode of the chuck.

In a preferred embodiment, the support also serves as an electrostatic chuck, and a DC voltage is applied to the electrode in the dielectric member to electrostatically hold the substrate to the chuck. The dual function support serves both to generate a plasma in the chamber and to electrostatically hold the substrate. This configuration eliminates extraneous components, such as separate electrostatic chuck structures, from the confined volume of the chamber.

In another aspect, the present invention comprises a method for processing a substrate in a plasma zone with enhanced uniformity. In the method, a substrate is placed on the dielectric member in the plasma zone. This dielectric member includes the electrode embedded therein, and is supported bar an underlying electrical conductor having a peripheral portion that extends beyond the electrode of the dielectric member. An RF bias voltage is supplied to the electrode in the dielectric member to energize plasma in the chamber and to capacitively couple RF power from the electrode to the underlying conductor. The peripheral portion of the conductor is capacitively coupled to the plasma, beyond the edge of the electrode, to provide an extended plasma sheath that provides a more uniform density or energy distribution of plasma ions around the perimeter of the substrate.

DRAWINGS

These and other features, aspects, and advantages of the present invention will become better understood with regard to the following description, appended claims, and accompanying drawings which illustrate examples of the invention, where:

DESCRIPTION

Figure 1:
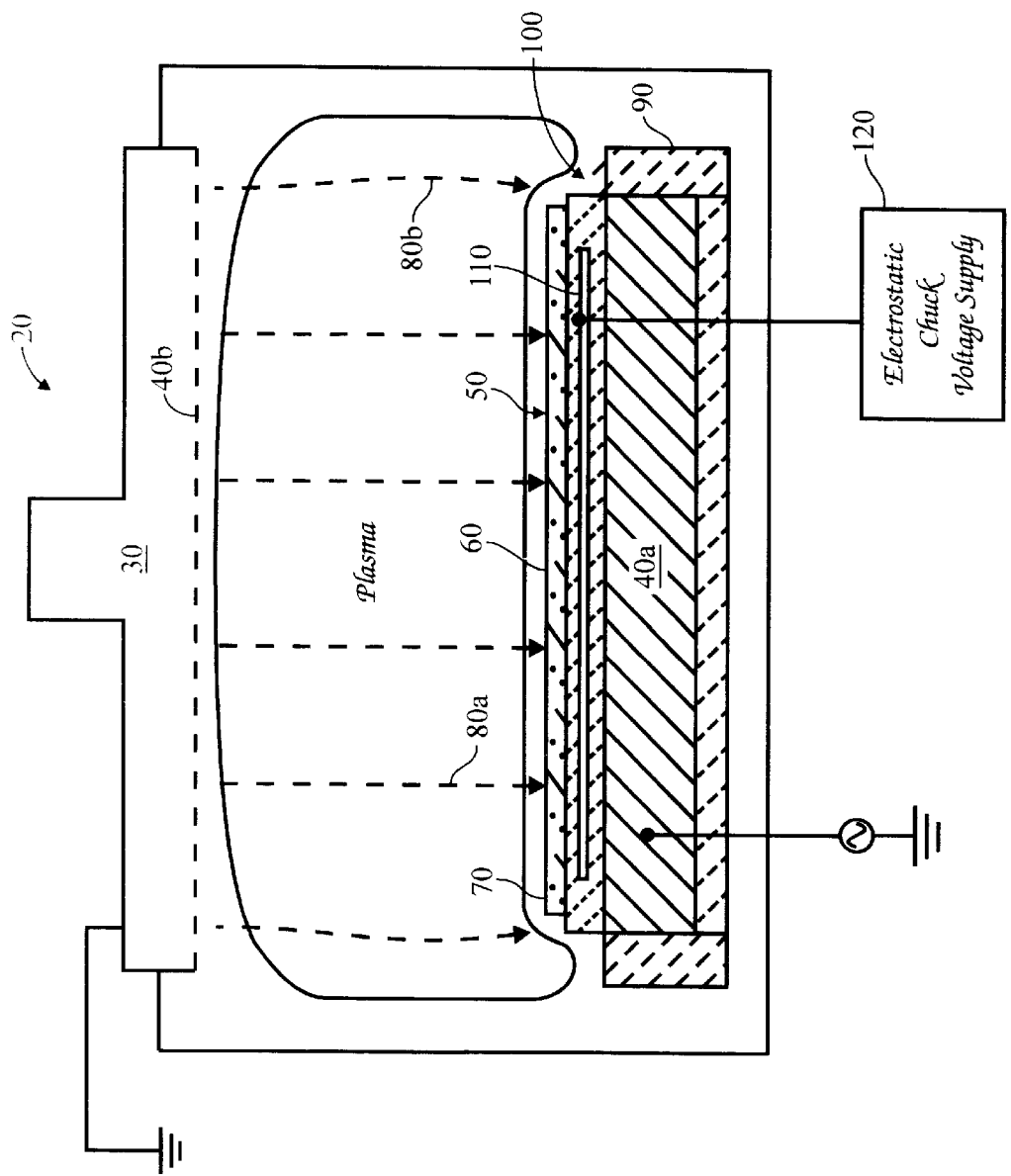
FIG. 1 (prior art) is a sectional schematic view of a prior art process chamber showing a non-uniform plasma sheath across the surface of the substrate.
Figure 2:
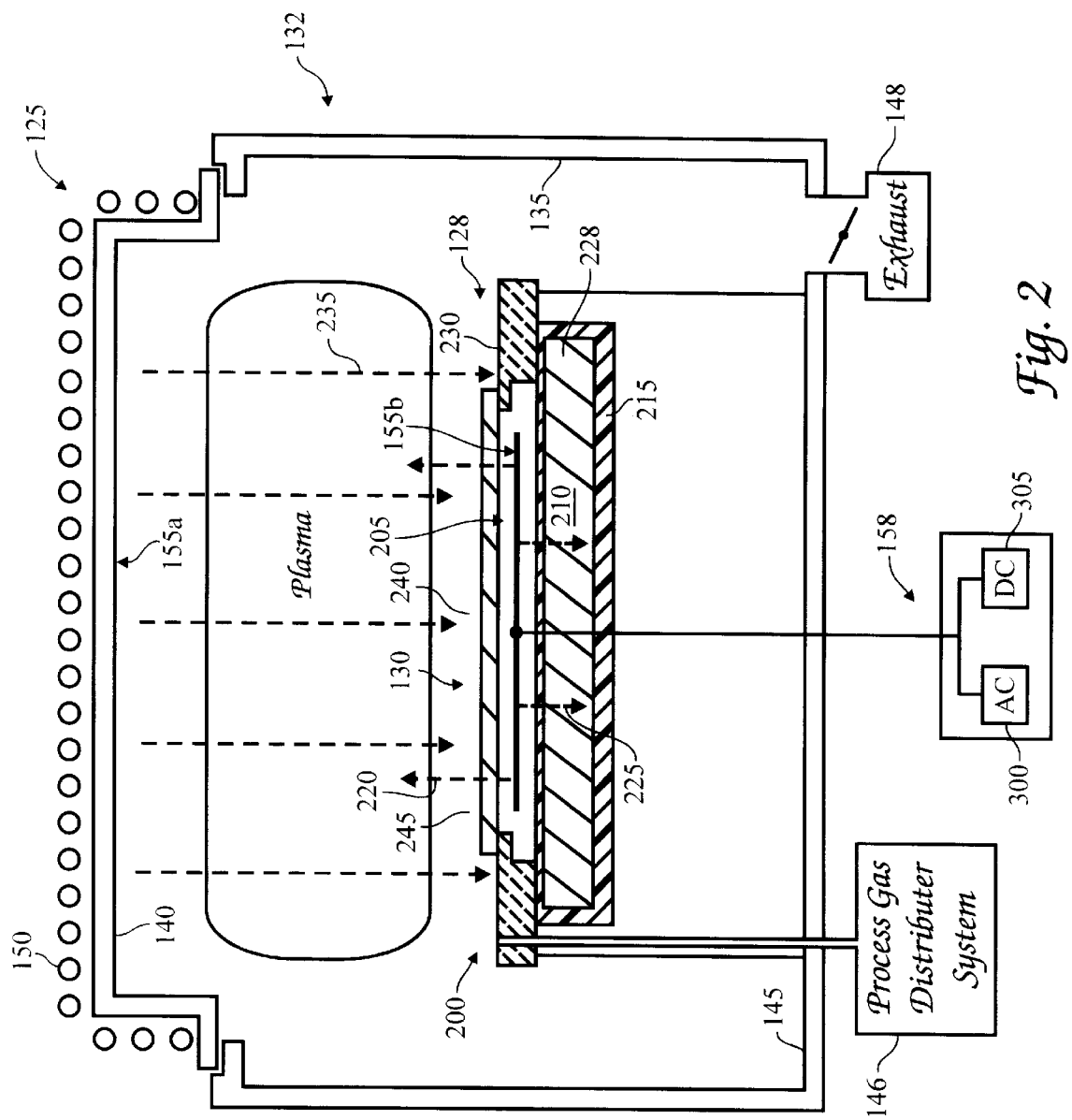
FIG. 2 is a sectional schematic view of a substrate support and process chamber according to the present invention showing a uniform plasma sheath obtained across a substrate on the support in the chamber.
Figure 3:
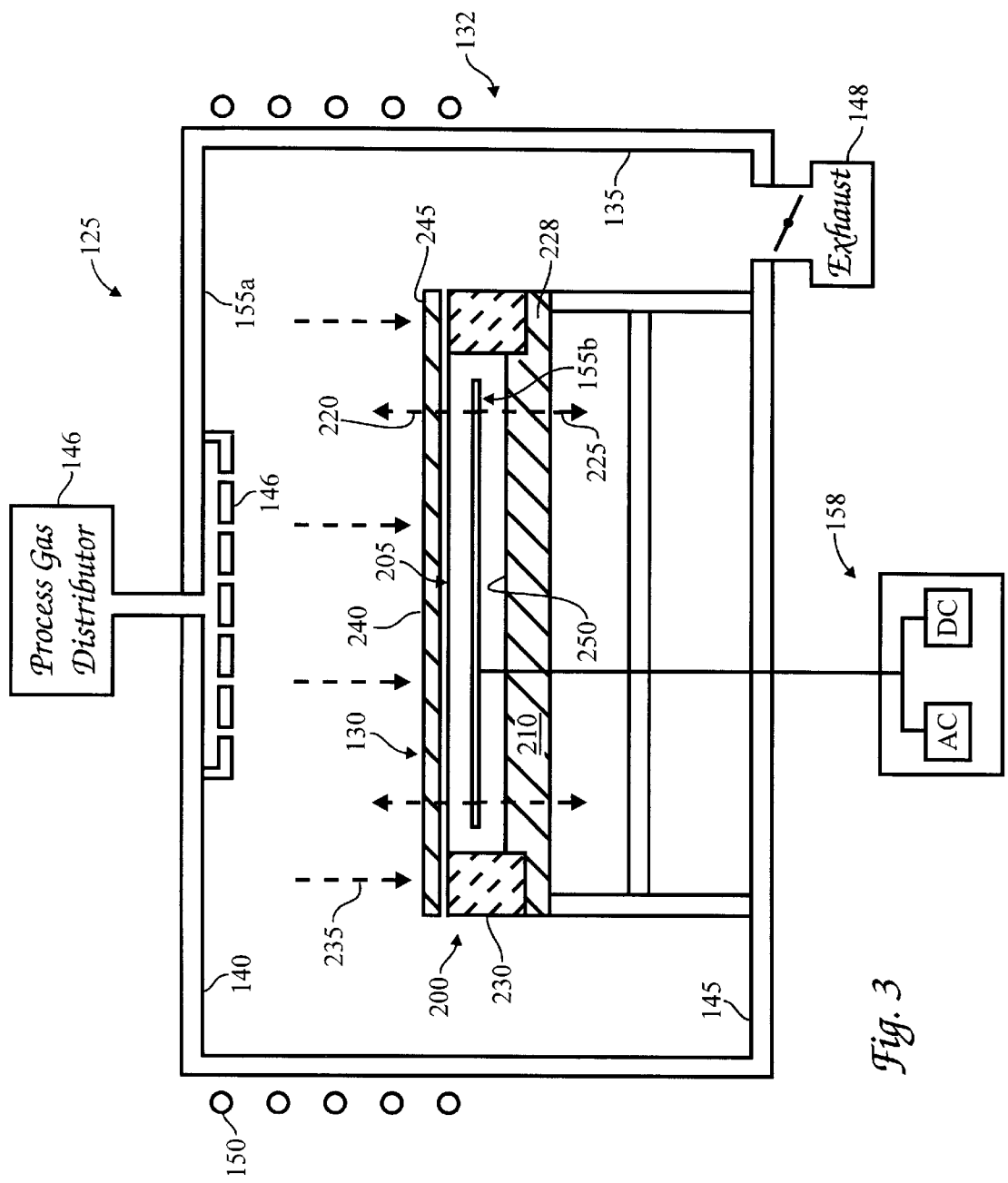
FIG. 3 is a sectional schematic view of another version of a process chamber and support according to the present invention.

The apparatus of the present invention is capable of providing a plasma sheath having a uniform plasma ion and plasma energy distribution across a surface of a substrate. The apparatus can be used to form a plasma for etching the substrate by plasma etching or reactive ion etching; for implanting material in the substrate by ion implantation; or for depositing material on a substrate by chemical vapor deposition or sputtering. An exemplary processing apparatus 125 suitable for plasma processing of a semiconductor substrate 130, is schematically shown in FIG. 2. The particular embodiment of the apparatus 125 shown herein is provided only to illustrate operation of the invention and should not be used to limit the scope of the invention. The plasma processing apparatus 125 generally comprises an enclosed process chamber 132 having sidewalls 135, a top wall 140 and a bottom wall 145. Process gas which is used to process the substrate 130 is introduced into the chamber 132 through a gas distributor system 146 which typically includes a process gas supply, a gas flow control system, and gas flow meters. The process gas is introduced adjacent to the periphery of the substrate 130, as shown in FIG. 2, or from above the substrate 130 through a perforated "showerhead" gas diffuser capable of distributing process gas substantially uniformly across the substrate, as shown in FIG. 3. An exhaust system 148, comprising one or more exhaust pumps and throttle valves, is used to exhaust spent process gas byproducts and to control the pressure of process gas in the chamber 132. Typically, a computer control system operates the gas distributor system 146 and the exhaust system 148 using programmed process conditions. The process chamber 132 and the various components therein can be made from a variety of materials including metals, ceramics, glasses, polymers and composite materials, using conventional machining and molding methods. Metals that can be used to fabricate the process chamber 132 and components therein, include aluminum, anodized aluminum, "HAYNES 242," "Al-6061," "SS 304," "SS 316," and INCONEL, of which anodized aluminum is generally preferred.

The process gas in the chamber 132 is energized to form a plasma, or to accelerate plasma ions toward the substrate, by capacitively coupling one or more process electrodes 155a, 155b that are electrically biased relative to one another by a voltage supply 158, and optionally, by using one or more inductor coils 150 adjacent to the chamber 132 to generate an inductive field in the chamber. Combined inductive and capacitive coupling, in which both the inductor coil 150 and the process electrodes 155a, 155b are simultaneously powered, provides a high density plasma having a more uniform distribution of plasma ions across the substrate.

A support assembly 200 that also serves to support the substrate 130 in the chamber, generally comprises a dielectric member 205 having the electrode 155b embedded therein, and having a receiving surface over the electrode for receiving the substrate 130. Typically the voltage supply 158 is electrically connected to the electrode 155b and the other electrode 155a is electrically grounded so that the electrodes are electrically biased relative to one another. The voltage supply 158 includes an RF bias voltage source that provides an RF bias voltage to the electrode for generating first RF field components that couple through the substrate to energize a plasma above the substrate (as schematically illustrated by the arrows 220), and second RF field components that extend downwardly from the electrode 155b (as schematically illustrated by the arrows 225). The plasma ions in the chamber 132 are attracted toward the substrate 130 by the capacitively coupled first RF field components that are formed between the two process electrodes.

An electrical conductor 210 supporting the dielectric member 205, comprises a peripheral portion 228 that extends beyond the electrode in the dielectric member. A collar ring 230 positioned on the peripheral portion of the conductor 210, comprises a RF electrical field absorption sufficiently low to capacitively and resistively couple RF power from the peripheral portion 228 of the conductor 210 through the collar ring 230, and to the plasma sheath in the chamber. The peripheral or third RF field components formed around the perimeter of the substrate 130 provides an extended plasma sheath that can provide more uniform processing of the substrate. In this manner, the support assembly 200 provides an improved plasma ion distribution across the surface of the substrate 130 by extending the plasma sheath beyond the edge of the electrode 155b, and preferably beyond the edge of the substrate.

Particular aspects of the support assembly will now be disclosed. The dielectric member 205 of the support 200 comprises a dielectric material, and more preferably a semiconducting dielectric material, that electrically insulates the electrode 155b and prevents electrical shorting to the plasma in the chamber 132. The dielectric layer covering the electrode 155b comprises a relatively low RF electrical field absorption that allow the electrode 155b to capacitively couple through the dielectric member 205, and the overlying substrate 130. The dielectric member 205 can also comprise a semiconducting dielectric material having a low conductivity, such as undoped or doped ceramic materials, for example, aluminum oxide, aluminum nitride, silicon, silicon carbide, silicon nitride, titanium oxide, yttrium oxide, zirconium oxide, and mixtures thereof. The dielectric member 205 has a smooth receiving surface that directly contacts and supports the substrate 130 to provide relatively uniform electrical coupling therethrough. Preferably, the dielectric member comprises a volume resistivity of from about $10^9$ $\Omega$cm to about $10^{11}$ $\Omega$cm to limit current leakage from the electrode 155b to the substrate 130 at operating temperatures.

Preferably, the dielectric member 205 comprises a unitary monolithic ceramic structure with the embedded electrode 155b that has low porosity levels of less than about 10% porosity, more preferably less than about 5% porosity, and most preferably less than 2% porosity. Suitable ceramic monoliths are fabricated by isostatic pressing, hot pressing, mold casting, or tape casting. Alternatively, the dielectric member 205 can comprise a laminate construction of polyimide or aramid layers stacked around an electrode 155b, which are typically fabricated by an autoclave pressure forming processes, as disclosed in U.S. patent application Ser. No. 08/381,786 to Shamouilian, filed on Jan. 31, 1995, which is incorporated herein by reference.

The thickness of the dielectric layer of the dielectric member 205 that is above and below the electrode 155b depends upon the electrical properties of the dielectric material, such as dielectric constant, resistivity, and thickness. Preferably, the thickness of the dielectric member 205 above the electrode 155b is sufficiently thin to allow the electrode to capacitively couple RF power to the plasma through the overlying substrate 130 without excessive attenuation of the RF power. The upper dielectric layer covering the electrode 155b should be sufficiently thin to allow the RF power from the electrode to electrically couple to the plasma. The upper layer of the dielectric member 205 has an RF field attenuation sufficiently small to allow coupling of first RF field components directed in an upward direction from the electrode 155b toward the plasma and toward the second upper electrode 155a (or in the reverse direction depending on the differential voltage applied to the electrodes 155a, 155b). A suitable thickness of the upper covering dielectric layer is from about 100 microns to about 3 mm. The lower dielectric layer supporting the electrode 155b should be sufficiently thin to allow the downward component of the RF field from the electrode 155b to capacitively couple RF power from the underlying conductor 210 without excessive attenuation of the RF field. The lower dielectric layer capacitively couples second RF field components that are directed in a downward direction to the underlying conductor 210. A suitable thickness of the lower dielectric layer depends upon the electrical properties of the dielectric material and can be tailored to provide the desired coupling strength. A typical thickness of this second dielectric layer is from about 100 microns to about 5 mm.

The electrode 155b embedded in the dielectric member 205 is fabricated from a conductive metal such as aluminum, copper, silver, gold, molybdenum, tantalum, titanium, or mixtures thereof. Preferred metals comprise high melting point metals, such as copper, tantalum, tungsten, platinum, rhenium, hafnium, and alloys thereof; which are preferred when the dielectric member is formed using high temperature processing. The electrode 155b can comprise a layer of conducting material, for example, a copper layer about 1 to 100 microns thick, that is embedded in the dielectric member 205. Alternatively, the electrode can comprise a wire mesh having wires with a diameter of about 0.01 to about 5 mm, a mesh size of about 2 to 400 mesh, and a circular, elliptical, or rectangular cross-section.

Preferably, the dielectric member 205 with the embedded electrode 155b also serves as an electrostatic chuck that electrostatically holds the substrate 130 to the support to prevent movement or misalignment of the substrate during processing. In this embodiment, the voltage supply 158 electrically connected to the electrode 155b in the dielectric member 205 further supplies a chucking voltage to the electrode 155b for generating an electrostatic charge in the electrode or surrounding dielectric member that electrostatically holds the substrate 130. In this function, the voltage supply 158 typically comprises a chucking voltage source that generates a DC chucking voltage of from about 200 volts to about 2000 volts, that is applied to the electrode 155b concurrently with application of the RF bias voltage. The electrode 155b can also comprise one or more conductors that are electrically isolated from one another, such as for example, bipolar or tripolar electrodes, that are maintained at different electric potentials by the voltage supply.

The support assembly 200 further comprises a conductor 210 below the dielectric member 205 that is made of an electrically conducting material and has an upper surface suitable for supporting the dielectric member 205 in the process chamber 132. In one configuration, the conductor 210 comprises a metal plate, such as an aluminum plate, positioned immediately below the dielectric member 205. The conductor is capacitively coupled to the electrode 155b through the dielectric layer that lies between the electrode 155b and the conductor 210. The peripheral portion 228 extends beyond the perimeter of the electrode 155, and more preferably extends beyond the peripheral edge of the substrate 130. The RF voltage applied to the electrode 155b provides second RF field components that emanate from the electrode 155b in a downwardly direction toward the underlying conductor 210. These field components capacitively couple the electrode 155b to the underlying conductor 210. Because the electrode 155b is separated and electrically insulated from the conductor 210 by the dielectric member 205, the support assembly 200 functions as a capacitor and electrically couples RF power from the electrode 155b to the conductor 210. Once the second RF field components are coupled to the conductor they are electrically conducted to the peripheral portion 228 of the conductor 210 that extends around and beyond the perimeter of the electrode 155b. In this manner, the dielectric member 205 with the embedded electrode is used to generate second RF field components that are transmitted to the region near the periphery of the substrate 130.

A collar ring 230 is positioned on the conductor 210 in direct electrical contact with its peripheral portion 228. The collar ring 230 has an electrical field absorption sufficiently low to allow RF power from the peripheral portion 228 of the conductor 210 to couple to the plasma through the collar ring and extend the plasma sheath beyond the perimeter of the substrate 130. This significantly reduces anomalies or discontinuities in the plasma sheath at the edge or perimeter of the substrate 130 and provides more uniform plasma processing rates or characteristics across the substrate. It is believed that the collar ring 230 functions by allowing the second RF field components in the peripheral portion 228 of the conductor 210 to couple and form third RF field components that extend transversely through the collar ring 230 to complement the first RF field components extending upwardly from the electrode 155b. The RF field of coupling of the collar ring 230 can be schematically represented by third RF field component illustrated by the arrows 235, that are energized by the RF field in the conductor 210. In this manner, the combination of the electrically conducting peripheral portion of the conductor 210 and the overlying collar ring 230 functions as an extension of the electrode 155b. As a result, the effective capacitively coupled area of the electrode 155b is increased by the coupling that occurs across the collar ring 230. The extended plasma sheath resulting from the circumferentially coupled collar ring 230 provides a more uniform distribution of plasma ions across the perimeter of the substrate 130.

Figure 4:
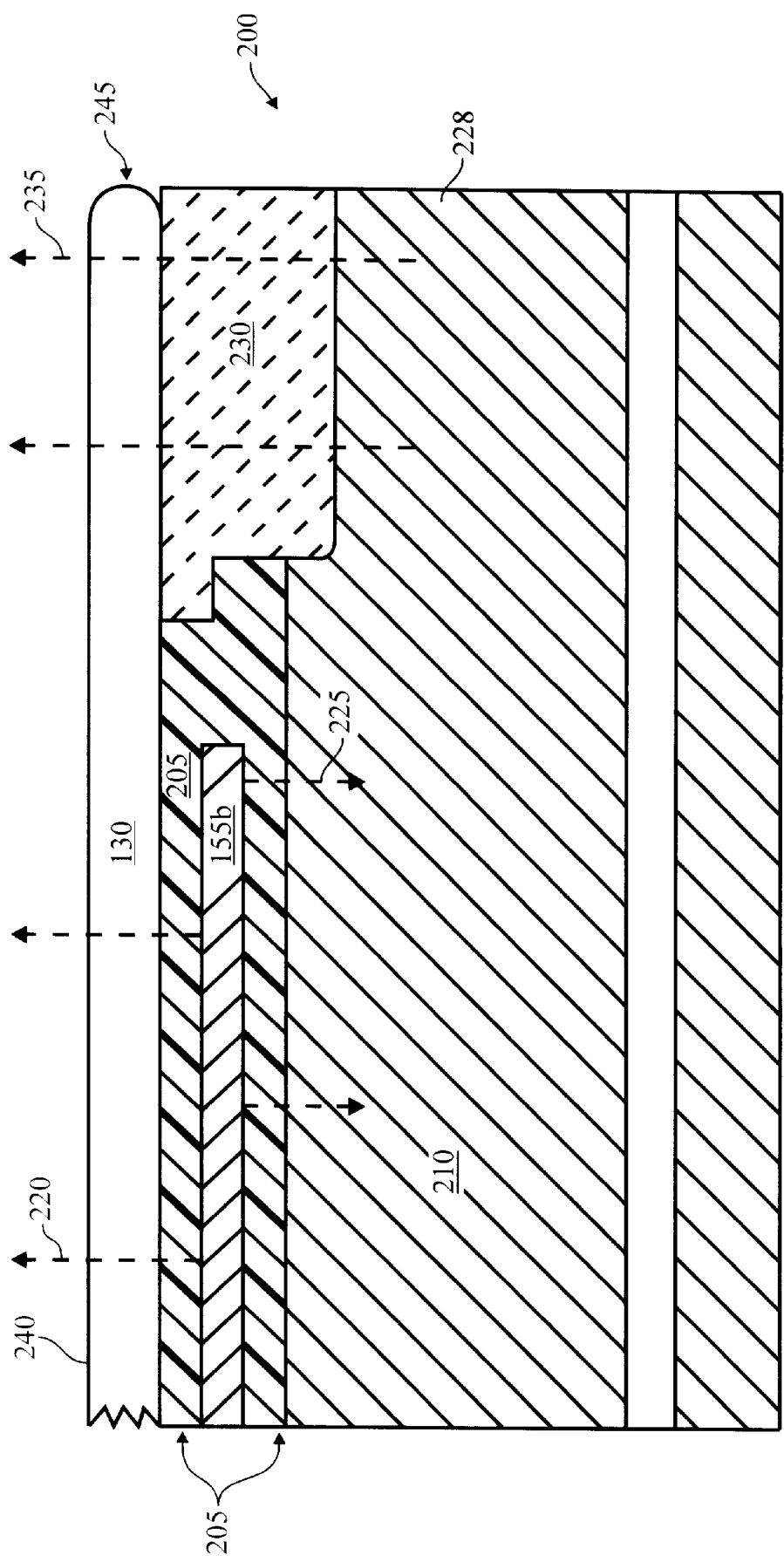
FIG. 4 is a sectional schematic view of yet another embodiment of a support according to the present invention.

The shape and size of the conductor 210, and the diameter of the collar ring 230 resting on the conductor 210, are selected to increase the active area of the electrode 155b to provide a field span and resultant plasma sheath that extends beyond the periphery of the electrode 155b. Preferably, the conductor 210 is made from a metal plate that is shaped and sized to correspond to the shape and size of the substrate 130. For a circular substrate having a diameter of about 200 mm (8-inch), a suitable diameter for the conductor 210 is from about 200 to about 220 mm. As illustrated in FIGS. 3 and 4, the conductor 210 can be pedestal shaped with a raised central portion 250 that is typically from 190 to 200 mm in diameter, and a lower peripheral ledge 228 extending around the raised central portion.

The collar ring 230 comprises an annular ring or layer of dielectric or semiconducting dielectric material that covers the peripheral portion 228 of the conductor 210 and that is sufficiently thin to couple a substantial amount of RF power from the peripheral portion of the conductor 210 to the plasma sheath surrounding the perimeter of the substrate 130. The shape and thickness of the collar ring 230 depend upon the absorption properties of the material used to fabricate the collar, and in particular, the absorption characteristics for the particular RF frequencies applied to the electrode 155b. Both the upper surface of the conductor 210 and the lower surface of the collar ring 230 (where the collar ring is a separate structure and not a coating that conforms to the smooth surface of the conductor) are polished to provide smooth upper surface that can evenly and uniformly couple RF power between the conductor 210 and the collar 230, without interfering electrical impedances from intervening air gaps and other features formed by excessive surface roughness. The smooth coupling surfaces reduces interfacial air gaps and other such contact resistance, and increases the strength of the RF field coupling between the two components. In addition, the smooth coupling surfaces also reduce arcing and glow discharges in the interfacial space by reducing the access of external charged plasma species to the interfacial region and/or by providing smaller mean free path lengths for excited gaseous species which reduce the probability of avalanche breakdowns and resultant plasma formation. Preferably, the smooth coupling surface comprises a surface roughness having a peak to peak RMS of less than about 10 microns, more preferably less than about 3 microns, and most preferably less than about 0.5 microns.

In one version, the collar ring 230 is fabricated by forming a layer of dielectric or semiconducting dielectric material on the upper surface of the peripheral portion 228 of the conductor 210. The dielectric layer can be applied by conventional coating methods including flame spraying, plasma spraying, or solution coating, over the peripheral portion of the conductor. In another version, the collar ring 230 comprises a solid body annular ring having a lower coupling surface that is polished sufficiently smooth to provide uniform and even electrical coupling to the upper surface of the conductor 210. The annular ring is formed by conventional methods, such as casting, injection molding, or machining a ceramic or polymer material.

In a preferred embodiment, the collar ring 230 comprises an annular ring that is concentric to the electrode 155b and the conductor 210 such that the inner radial surface of the annular ring is in contact with the external radial surface of the conductor. As such, the inner diameter of the collar ring 230 is sized sufficiently large to tightly encircle the conductor 210. For example, for a circular shaped conductor 210 having a diameter of about 190 mm, a suitable inner diameter for the collar ring 230 is from about 190 mm to about 200 mm. The annular ring can also have an upper surface capable of supporting the substrate 130. Preferably, the upper surface of the annular ring 230 is substantially coplanar to the upper receiving surface of the support 200 and extends to the perimeter 245 of the substrate 130. Preferably, the annular ring is removable from the support to allow quick replacement of the annular ring when corroded or broken. For conventional dielectric or semiconducting dielectric materials, the thickness of the collar ring 230 is typically from about 5 to about 10 mm.

Preferably, the collar ring 230 is made from a dielectric material that is sufficiently thin to provide an RF electrical field absorption sufficiently low to capacitively couple RF power from the peripheral portion of the conductor 210 through the collar ring 230 to the plasma at RF frequencies of about 1 to about 20 MHZ. Suitable dielectric materials comprise a dielectric constant of at least about 2 or more, and a dielectric breakdown strength of about 0.1 to about 1 volts/nm. Suitable dielectric ceramic materials for fabricating the collar ring 230 include aluminum oxide, aluminum nitride, boron carbide, boron nitride, silicon, silicon oxide, silicon carbide, silicon nitride, titanium oxide, titanium carbide, zirconium boride, zirconium carbide, and equivalents or mixtures thereof. Suitable polymeric materials for forming the collar ring 230 include polyimide, polyketone, polyetherketone, polysulfone, polycarbonate, polystyrene, polyvinylchloride, polypropylene, polyethersulfone, polyethylene, nylon, silicone, and rubber. For processes where the substrate 130 is heated, preferably, the dielectric material selected for the collar ring 230 is resistant to temperatures in excess of 200° C.

In a preferred embodiment, the collar ring 230 is made from a semiconducting dielectric material that has low electrical resistance that allows DC field components to be transmitted or conducted through the collar ring 230. By semiconducting dielectric it is meant that the material has a higher electrical conductivity than insulator materials, and a lower electrical conductivity than metals. The semiconducting dielectric material also comprises a resistivity sufficiently low to allow DC electric field components to be electrically coupled from the conductor 210 to the collar ring 230 to provide a more consistent and uniform plasma sheath above the perimeter of the substrate. These DC field components even or balance out the DC potential at the edge of the substrate where edge effects are normally highly pronounced. The more balanced or level DC field potential across the substrate perimeter also reduces the possibility of electrical arcing at the edge of the electrode 155b. Preferably, the semiconducting dielectric collar ring 230 comprises a resistivity of about $10^{-3}$ Ωcm to about $10^2$ Ωcm, and more preferably from about $10^{-3}$ Ωcm to about $10^1$ Ωcm. Suitable semiconducting ceramic materials for fabricating the collar ring 230 include for example, "doped" ceramic materials, such as mixtures of the ceramic materials described herein, such as aluminum oxide and titanium oxide, or aluminum nitride and other conduction additives, as well as silicon, silicon carbide and silicon nitride. Typically, the conduction enhancing additives form interstitial or grain boundary conducting species in the crystal structure of the ceramic that provide the higher conduction. For processes where the substrate 130 is heated, preferably, the semiconducting dielectric material is selected to have the desired resistance or conductance at the operating temperatures of in the chamber 132. Also, materials such as silicon are preferred for plasma environments in which a lack of chemical compatibility between the silicon substrate and the surrounding collar ring can result in lower substrate yields. The silicon collar ring 230 produces the same species gaseous byproducts in the plasma environment as the silicon substrate and limits or reduces contamination of the substrate. Alternatively, a non-reactive material, such as silicon carbide, may be more desirable for plasma environments in which it is desirable to reduce or eliminate chemical reaction between the collar ring 230 and the plasma.

A two-dimensional distribution of electric field lines and resultant plasma ion density around the substrate 130, electrode 155b, collar ring 230, and conductor 210 was numerically modeled using a modeling program. Several simplifications were used for modeling the RF field lines and resultant plasma distribution. Collisions of plasma ions were ignored and the random motion of the ions were assumed to be much smaller than the directional motion of the ions. The electrons in the plasma were assumed to have Maxwell-Boltzmann energy distribution functions that provide an exponential dependence of plasma ion density on electrical potential. The interactions of plasma ions with the surface of the chamber walls 135 were assumed to result in complete absorption of ions. The dielectric member 205 covering the electrode 155b is assumed to have a small charge mobility therethrough, and surface charges in the system were assumed to build up until electron and ion fluxes to the surface are equal. In the simulation, the ions were formed at the top of the simulation box and entered from the top edge of the box. It was also assumed that the RF charge on the substrate 130 did not affect ionization source rates.

Figure 5:
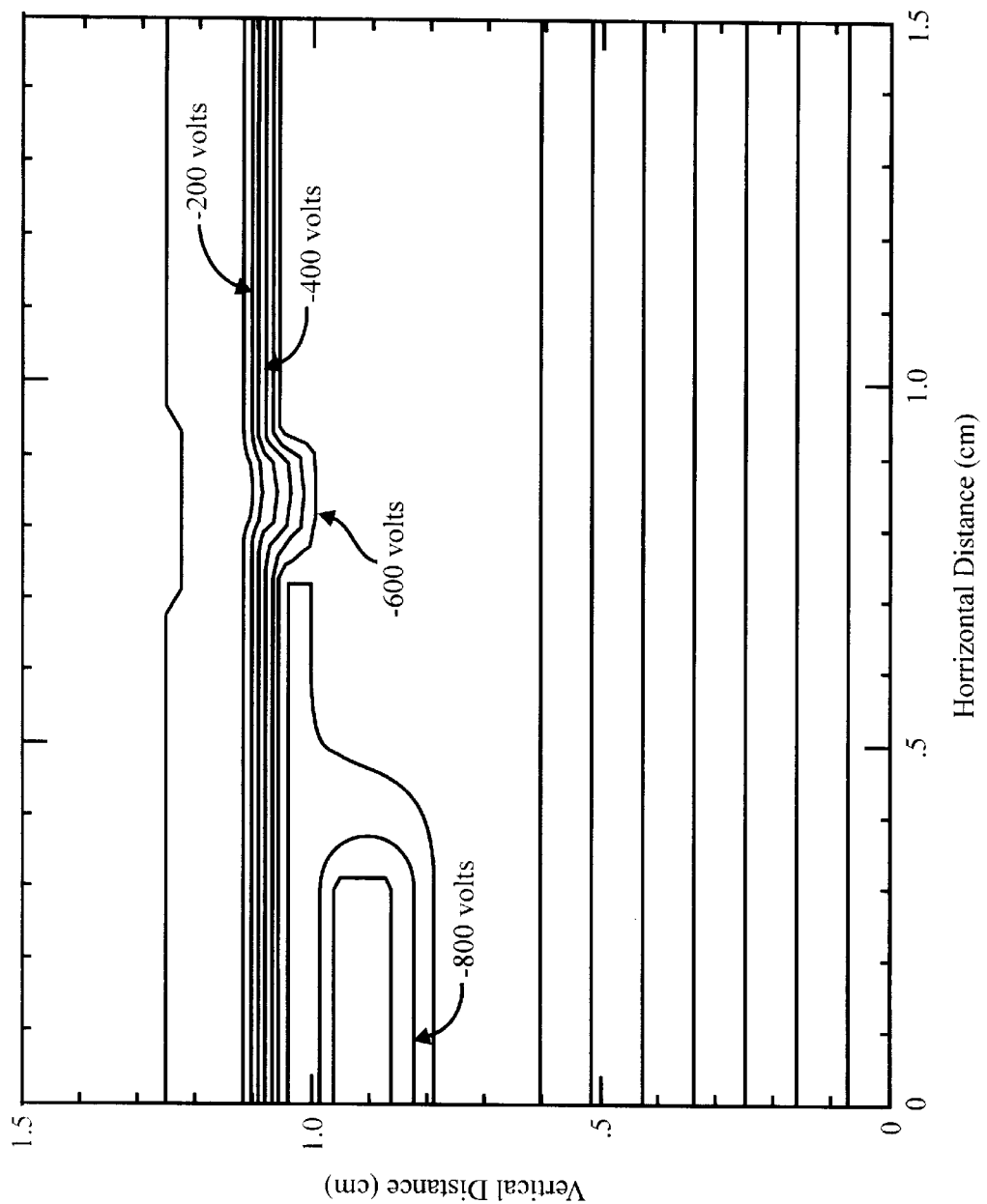
FIG. 5 is a graph of the uniform potential distribution lines obtained utilizing the support of FIG. 4.

FIG. 4 shows a partial sectional schematic view of the support 200 according to the present invention that is placed in a stimulation box used for the modeling study. The support 200 includes the electrode 155b, the dielectric member 205 covering the electrode, the conductor 210, and the collar ring 230 supported on a peripheral edge of the conductor 210. FIG. 5 is a graph of numerically generated plots that show the uniformly distributed electric: potential lines across the surface of the dielectric member 205 and across the collar ring 230 of the support 200. This is indicated by the substantially parallel electric potential lines at varying electrical potentials such as −200, −400, −600, and −800 volts. Generally, the modeled electric potential lines were parallel to the surface of the dielectric member 205 and collar ring 230, and extended uniformly across the surface of the substrate 130. The small "dip" in the electric potential lines that occurred at the boundary between the electrode 155b and the collar ring 230 is a minimal change in the generally uniform electric potential lines and has little or no effect on plasma ion distribution. Because the RF field lines are perpendicular to electric potential lines, the support 200 of the present invention advantageously provides RF field lines that are also substantially perpendicular to, and extend uniformly across, from the center 240 to the perimeter 245 of the substrate 130. Also, the electric field was generated by applying an RF voltage at about 1.7 or 13.56 MHZ to the electrode 155b. Since the electric field is an alternating RF field, FIG. 5 is a snap shot in time of the electric potential lines around the support 200.

Figure 6:
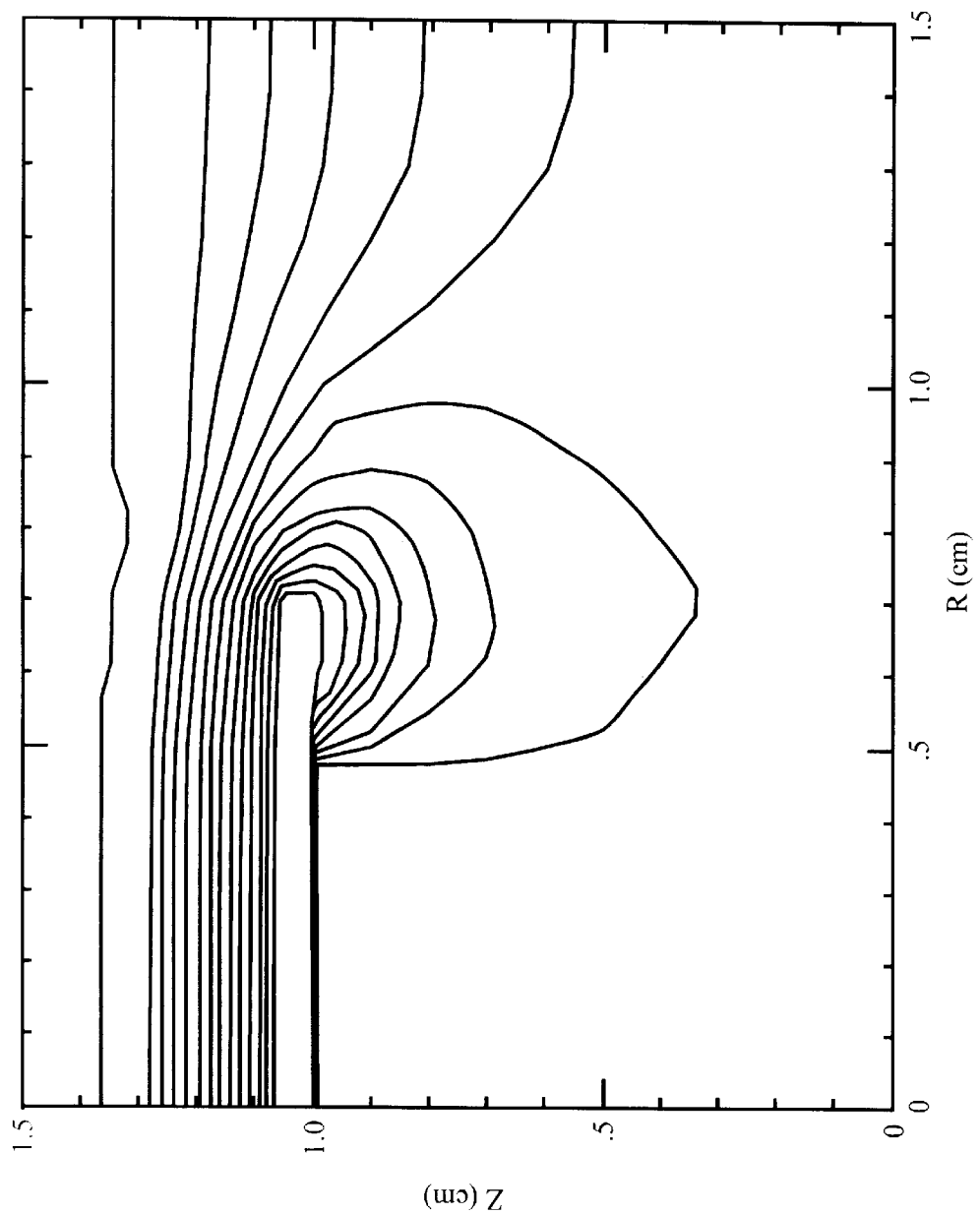
FIG. 6 is a graph of the non-uniform potential distribution lines obtained utilizing a conventional support on a conductor.

In contrast, FIG. 6 shows the numerically modeled electric potential lines for a conventional support that does not use a conductor 210 and overlying collar ring 230, as part of the support assembly 200. The electric potential or field lines deviate from perpendicular to form concentric elliptical lines that bend around the edges of the support. The potential line curves downward towards the lower surface of the electrode to provide electrical field lines (which are perpendicular to the potential lines) that bend around the edge of the electrode. This results in a non-uniform plasma ion distribution across the surface of the substrate 130, particularly at the perimeter of the substrate, and non-uniform processing rates across the substrate surface.

Thus the support 200 of the present invention, having a peripherally extending conductor 210 with an overlying collar ring 230, extends the plasma sheath beyond and across the perimeter 245 of the substrate. The extended plasma sheath provides a more uniform distribution and flux of plasma ions across the processing surface of the substrate 130. The extended plasma sheath adjacent to the perimeter of the substrate 130 significantly improves the yields of integrated circuit chips at the substrate perimeter 245. An additional advantage is that the collar ring 230 is separately removable from the support 200 and can be easily replaced upon erosion or corrosion, without replacement of the entire support. Also, the conductivity and chemical resistance properties of the removable collar rings 230 can be selected to provide the electrical and chemical characteristics needed for a particular plasma process. For example, different collar rings 230 having different electrical properties, such as different electrical resistance or dielectric constant values, can be used for different substrate processing environments, to render more uniform the plasma sheath around the substrate, as will be apparent to those skilled in the art.

The plasma processing apparatus 125 of the present invention can be used to deposit, etch, or implant material on the substrate 130, and maintain an extended plasma sheath and uniform distribution of reactive plasma ions across the substrate surface. To use the apparatus 125, the substrate 130 is placed in the process chamber 132, and process gas is introduced in the process chamber 132 via the gas distributor 146 at a controlled pressure. Process gas flow rates, chamber pressure, and substrate temperature depend on the particular process being carried out. Chemical vapor deposition (CVD) processes that can be performed in the apparatus 125 to deposit coatings on the substrate 130 are generally described in Chapter 9, VLSI Technology, 2nd Ed., Ed. by Sze, McGraw-Hill Publishing Co., New York, which is incorporated herein by this reference. Typical chemical vapor deposition (CVD) processes for depositing $SiO_2$ on a substrate, use process gases such as (i) silicon source gas, for example $SiH_4$ or $SiCl_2H_2$, and an oxygen source gas such as $CO_2$ or $H_2O$, or $N_2O$; or (ii) a single gas containing both silicon and oxygen such as $Si(OC_2H_5)_4$. CVD processes for depositing silicon or $Si_3N_4$ on the substrate typically use gases such as $SiH_4$, $NH_3$, $N_2$, $B_2H_6$, HCl, and $PH_3$. Other conventional CVD process gases include $NH_3$, $AsH_3$, $B_2H_6$, HCl, $PH_3$ and $SiH_4$. The apparatus 125 can also be used for plasma etching processes as generally described in *VLSI Technology, Second Edition,* Chapter 5, by S. M. Sze, McGraw-Hill Publishing Company (1988), which is incorporated herein by reference. Typical etching processes use process gases such as $BCl_3$, $Cl_2$, $SF_6$, $CF_4$, $CFCl_3$, $CF_2Cl_2$, $CF_3Cl$, $CHF_3$, $C_3F_8$, $C_4F_8$ and $C_2ClF_5$; and resist etching processes typically use oxygen-containing etchant gas to etch the resist on the substrate. Plasma processes that use $NF_3$ to clean substrates 130 are generally described in U.S. Pat. No. 5,201,990, to Chang, et al., which is also incorporated herein by reference. Typically, the process gas flow rates range from 50 to 3000 sccm; chamber pressures range from 1 mTorr to 100 Torr; and substrate temperatures range from 25 to 500° C.

Figure 7:
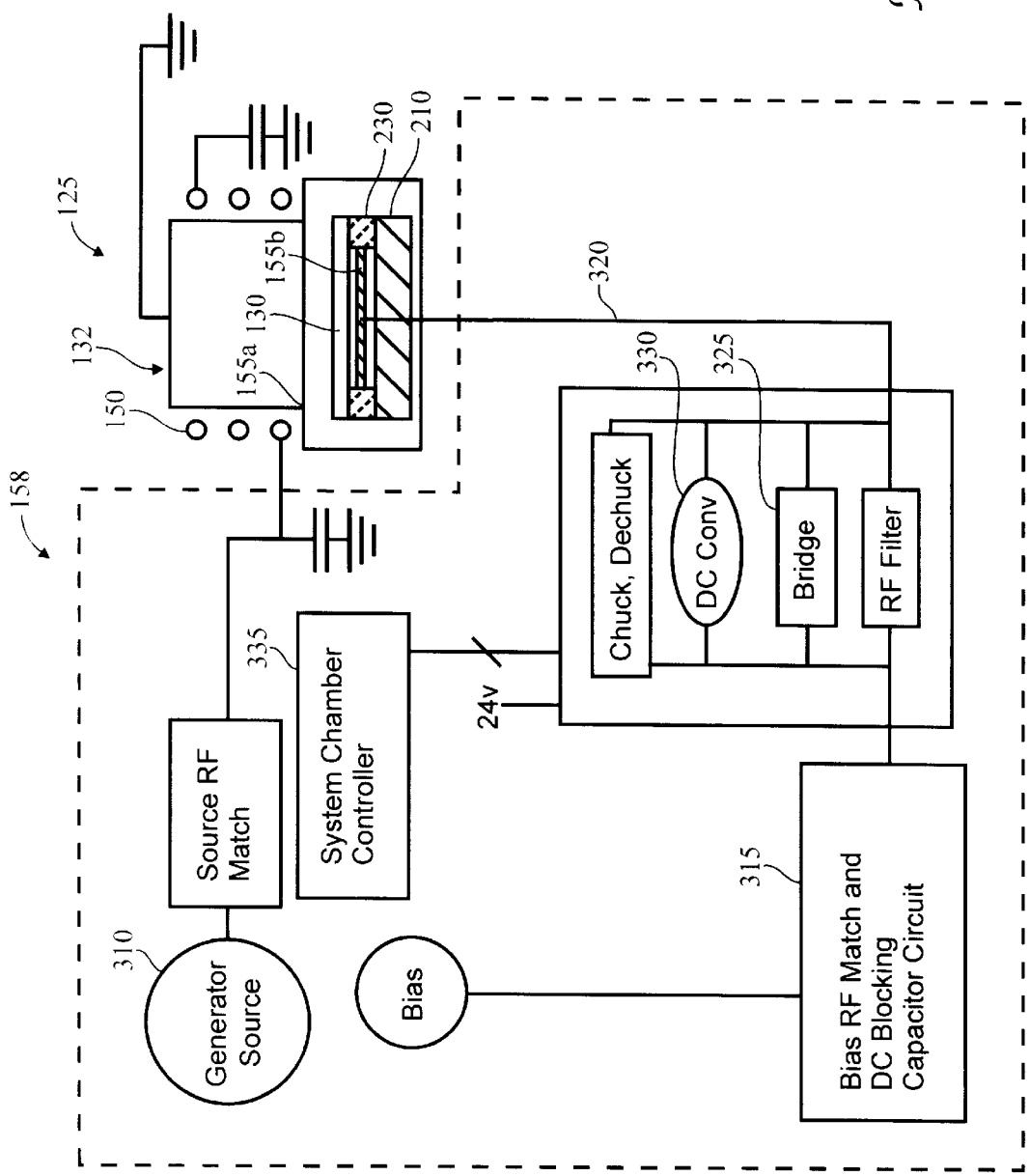
FIG. 7 is a schematic block diagram of a power supply for powering an electrode in the support.

FIG. 7 shows an exemplary block diagram of an embodiment of a voltage supply 158 electrically connected to the electrode 155b of the process chamber 132. The voltage supply 158 includes an AC voltage supply that provides a plasma generating RF voltage to the electrode 155b, and a DC voltage supply that provides a DC chucking voltage to the electrode 155b. The AC voltage supply provides an RF generating voltage having one or more frequencies from 400 KHz to 13.56 MHZ to power the electrodes 155a, 155b to form a capacitively coupled plasma in the chamber. The power level of the RF bias current applied to the electrode 155b is typically from about 50 to about 3000 Watts. A separate DC voltage is applied to the electrode 155b to form an electrostatic charge that holds the substrate to the support. The DC chucking voltage is typically about 250 to about 2000 volts.

The voltage supply 158 comprises a generator 310 connected to a source RF match circuit to provide an inductive coupling voltage to the coil 150 wound around the chamber 132. The voltage supply 158 also includes a bias RF match and DC blocking capacitor circuit 315 that is electrically connected to a DC chuck power supply. RF power from the circuit is fed to the electrode 155b through a cable 320 at a power level of about 50 to 3000 watts. When the process electrodes 155a, 155b are electrically biased with respect to one another by the RF voltage, the resultant extended area of the RF field in the chamber generates plasma ions from the process gas and/or attracts the plasma ions toward the substrate 130. The RF power is coupled to a bridge circuit 325 and a DC converter 330 to provide DC chucking power to the electrode 155b through the cable 320. The substrate 130 is electrostatically held to the receiving surface of the dielectric member 205 by the DC voltage biased electrode 155b. The voltage supply 158 can also include a system controller 335 for controlling the operation of the electrode 155b by directing a DC current, and RF current, or both, to the electrode for chucking and dechucking the substrate 130 and for generating plasma in the process chamber 132.

It is believed that the RF bias voltage applied to the electrode 155b generates (i) first RF field components that extends through the substrate 130 to form a plasma above the substrate, and (ii) second RF field components that couple to the underlying conductor 210. The collar ring on the peripheral portion 228 of the conductor allows the second field components in the conductor 210 to be electrically coupled from the conductor through the collar ring to the plasma, to provide third RF field components above the collar ring that complement the first RF field component. The resultant RF field surrounds and extends beyond the substrate perimeter 245 and attracts plasma ions directly towards the substrate 130 at a sufficient distance surrounding the substrate perimeter 245 to provide an extended plasma sheath. The resultant uniform plasma ion distribution in the chamber maintains substantially equal processing rates from the center 240 to the perimeter 245 of the substrate.

Although the present invention is described in considerable detail with regard to the preferred versions thereof, other versions are possible. For example, the collar ring can be integral with the sidewall of the process chamber, can form a unitary structure with the support, or can form a separate conductor and collar ring assembly that is electrically connected to the support. Many other variations in the shape and structure of the collar ring will be apparent to those skilled in the art, and such equivalent structures are within the scope of the present application. Therefore, the appended claims should not be limited to the descriptions of the preferred versions contained herein.

What is claimed is:

1. A support capable of supporting a substrate in a plasma process chamber, the support comprising:
   (a) a dielectric member having an electrode therein, and a receiving surface adapted to receive the substrate;
   (b) a conductor supporting the dielectric member, the conductor having a peripheral portion extending beyond the electrode in the dielectric member; and
   (c) a voltage supply adapted to supply an RF bias voltage to the electrode in the dielectric member,
   wherein the dielectric member is adapted to capacitively couple RF power from the electrode to the conductor.

2. The support of claim 1 wherein the thickness of the dielectric member above the electrode is sufficiently small to allow the electrode to capacitively couple RF power to the plasma through the overlying substrate, and the thickness of the dielectric member below the electrode is sufficiently small to allow the electrode to capacitively couple RF power to the underlying conductor.

3. The support of claim 1 wherein the voltage supply is further adapted to provide a DC voltage to the electrode to electrostatically hold the substrate to the dielectric member.

4. The support of claim 3 wherein the DC voltage is about 200 volts to about 2000 volts.

5. The support of claim 1 wherein the voltage supply provides an RF bias voltage at a power level of about 50 to about 3000 watts.

6. The support of claim 1 further comprising a collar ring on the peripheral portion of the conductor.

7. The support of claim 6 wherein the collar ring comprises a layer of dielectric material covering the peripheral portion of the conductor.

8. The support of claim 6 wherein the collar ring comprises a dielectric material having a dielectric constant of at least about 2, and wherein the collar ring is sufficiently thin to allow RF power from the conductor to couple to the plasma at RF frequencies of 1 to 20 MHZ.

9. The support of claim 6 wherein the collar ring comprises a semiconducting dielectric having a resistivity of about $10^{-3}$ $\Omega$cm to about $10^2$ $\Omega$cm.

10. The support of claim 6 wherein the collar ring comprises a lower coupling surface that is sufficiently smooth to uniformly contact the peripheral portion of the conductor to provide low impedance electrical coupling to the conductor.

11. The support of claim 6 wherein the collar ring comprises one or more of aluminum oxide, aluminum nitride, boron carbide, boron nitride, silicon, silicon oxide, silicon carbide, silicon nitride, titanium oxide, titanium carbide, zirconium boride, and zirconium carbide.

12. The support of claim 6 wherein the collar ring comprises one or more of polyimide, polyketone, polyetherketone, polysulfone, polycarbonate, polystyrene, polyvinylchloride, polypropylene, polyethersulfone, polyethylene, nylon, silicone, and rubber.

13. The support of claim 6 wherein the collar ring is sized sufficiently thin to capacitively couple RF power from the peripheral portion of the conductor through the collar ring to a plasma in the plasma process chamber.

14. The support of claim 13 wherein the thickness of the dielectric member above the electrode is sufficiently small to allow the electrode to capacitively couple RF power to the plasma through the overlying substrate, and the thickness of the dielectric member below the electrode is sufficiently small to allow the electrode to capacitively couple RF power to the underlying conductor.

15. A process chamber capable of processing a substrate in a plasma, the process chamber comprising:
  (a) a gas distributor adapted to introduce process gas in the chamber;
  (b) a dielectric member having an electrode therein, and a receiving surface adapted to receive the substrate;
  (c) a conductor supporting the dielectric member, the conductor having a peripheral portion extending beyond the electrode in the dielectric member;
  (d) a voltage supply adapted to supply an RF bias voltage to the electrode in the dielectric member; and
  (e) a collar ring on the peripheral portion of the conductor, wherein the dielectric member is adapted to capacitively couple RF power from the electrode to the conductor and the conductor is adapted to capacitively couple RF power from the peripheral portion through the collar ring to a plasma in the process chamber.

16. The process chamber of claim 15 wherein the RF bias voltage supplied to the electrode is adapted to generate first RF field components that extend through the substrate and couple directly to the plasma and second RF field components that couple to the underlying conductor.

17. The process chamber of claim 16 wherein the collar ring comprises an electrical field absorption sufficiently low to allow the, second RF field components in the conductor to electrically couple through the collar ring to form third RF field components above the collar ring that complement the first RF field components, thereby providing an extended plasma sheath that extends beyond the perimeter of the substrate.

18. The process chamber of claim 15 wherein the collar ring comprises a dielectric material having a dielectric constant of at least about 2, and wherein the collar ring is sufficiently thin to allow RF power from the conductor to couple to the plasma at RF frequencies of 1 to 20 MHZ.

19. The process chamber of claim 15 wherein the collar ring comprises a layer of dielectric or semiconductor material covering the peripheral portion of the conductor.

20. The process chamber of claim 19 wherein the collar ring comprises a semiconducting dielectric material having a resistivity of about $10^{-3}$ Ωcm to about $10^2$ Ωcm.

21. The process chamber of claim 15 wherein the thickness of the dielectric member below the electrode is sufficiently small to allow RF power from the electrode to capacitively couple to the underlying conductor.

22. The process chamber of claim 15 wherein the collar ring comprises a lower coupling surface sufficiently smooth to contact the peripheral portion of the conductor to provide low impedance electrical coupling to the conductor.

23. The process chamber of claim 13 wherein the voltage supply is adapted to provide a DC voltage to the electrode to electrostatically hold the substrate to the dielectric member.

24. The process chamber of claim 15, wherein the collar ring is sized sufficiently thin to capacitively couple RF power from the conductor to the plasma in the chamber.

25. An electrostatic chuck capable of electrostatically holding a substrate in a plasma process chamber, the electrostatic chuck comprising:

(a) a dielectric member having an electrode therein, and a receiving surface adapted to receive the substrate;
  (b) a conductor supporting the dielectric member, the conductor having a peripheral portion extending beyond the electrode in the dielectric member; and
  (c) a voltage supply adapted to supply an RF bias voltage to the electrode in the dielectric member and a DC voltage to the electrode to electrostatically hold the substrate on the dielectric member,
  wherein the conductor is electrically isolated from an external power supply.

26. The electrostatic chuck of claim 25 wherein the thickness of the dielectric member above the electrode is sufficiently small to allow the electrode to capacitively couple RF power to the plasma through the overlying substrate, and the thickness of the dielectric member below the electrode is sufficiently small to allow the electrode to capacitively couple RF power to the underlying conductor.

27. The support of claim 25 wherein the dielectric member is adapted to capacitively couple RF power from the electrode to the conductor.

28. The support of claim 25 further comprising a collar ring on the peripheral portion of the conductor.

29. The electrostatic chuck of claim 28 wherein the collar ring comprises a layer of dielectric or semiconductor material covering the peripheral portion of the conductor.

30. The process chamber of claim 28 wherein the collar ring comprises a dielectric material having a dielectric constant of at least about 2, and wherein the collar ring is sufficiently thin to allow RF power from the conductor to couple to the plasma at RF frequencies of 1 to 20 MHZ.

31. The electrostatic chuck of claim 28 wherein the collar ring comprises a semiconducting dielectric having a resistivity of about $10^{-3}$ Ωcm to about $10^2$ Ωcm.

32. The electrostatic chuck of claim 28 wherein the voltage supply provides a DC voltage of about 200 volts to about 2000 volts, and an RF bias voltage at a power level of about 50 to about 3000 watts.

33. The electrostatic chuck of claim 28 wherein the collar ring comprises one or more of aluminum oxide, aluminum nitride, boron carbide, boron nitride, silicon, silicon oxide, silicon nitride, titanium oxide, titanium carbide, zirconium boride, and zirconium carbide.

34. The electrostatic chuck of claim 28 wherein the collar ring comprises one or more of polyimide, polyketone, polyetherketone, polysulfone, polycarbonate, polystyrene, polyvinylchloride, polypropylene, polyethersulfone, polyethylene, nylon, silicone, and rubber.

35. The support of claim 28 wherein the collar ring is sized sufficiently thin to capacitively couple RF power from the peripheral portion of the conductor through the collar ring to a plasma in the plasma process chamber.

36. A support capable of supporting a substrate in a plasma process chamber, the support comprising:
  (a) a dielectric member having an electrode therein, and a receiving surface adapted to receive the substrate;
  (b) a conductor supporting the dielectric member, the conductor having a peripheral portion extending beyond the electrode;
  (c) a voltage supply adapted to supply an RF bias voltage to the electrode; and
  (d) a semiconductor collar ring on the peripheral portion of the conductor, the semiconductor collar ring having a resistivity of about $10^1$ Ωcm to about $10^3$ Ωcm,
  wherein the dielectric member is adapted to capacitively couple RF power from the electrode to the conductor.

37. The support of claim 36 wherein the thickness of the dielectric member between the electrode and the conductor is sufficiently small to allow the electrode to capacitively couple RF power to the underlying conductor.

38. The support of claim 36 wherein the collar ring comprises a lower coupling surface sufficiently smooth to uniformly contact the peripheral portion of the conductor to provide low impedance coupling of RF power from the conductor.

39. The support of claim 36 wherein the voltage supply further provides a DC voltage to the electrode for electrostatically holding the substrate on the dielectric member.

40. The support of claim 39 wherein the DC voltage is from about 200 volts to about 2000 volts.

41. The support of claim 36 wherein the voltage supply provides an RF bias voltage at a power level of about 50 to about 3000 watts.

42. The support of claim 36 wherein the collar ring comprises one or more of aluminum oxide, aluminum nitride, boron carbide, boron nitride, silicon, silicon oxide, silicon carbide, silicon nitride, titanium oxide, titanium carbide, zirconium boride, and zirconium carbide.

* * * * *